United States Patent [19]

Iwahashi et al.

[11] Patent Number: 4,697,101
[45] Date of Patent: Sep. 29, 1987

[54] READ/WRITE CONTROL CIRCUIT

[75] Inventors: Hiroshi Iwahashi, Yokohama; Masamichi Asano, Tokyo; Masaki Momodomi, Yokohama; Hidenobu Minagawa, Kawasaki; Kazuto Suzuki, Kawasaki; Akira Narita, Kawasaki, all of Japan

[73] Assignees: Kabushiki Kaisha Toshiba; Toshiba Micro-Computer Engineering Corp., both of Kawasaki; Tosbac Computer System Co., Ltd., Tokyo, all of Japan

[21] Appl. No.: 645,392

[22] Filed: Aug. 29, 1984

[30] Foreign Application Priority Data

| Aug. 30, 1983 | [JP] | Japan | 58-158723 |
| Sep. 8, 1983 | [JP] | Japan | 58-164112 |
| Feb. 13, 1984 | [JP] | Japan | 59-24581 |
| Apr. 23, 1984 | [JP] | Japan | 59-81289 |

[51] Int. Cl.$^4$ .............. H03K 19/096; H03K 17/16; G06F 7/38
[52] U.S. Cl. .................. 307/452; 307/443; 307/200 B; 307/469; 307/296 R; 307/481; 307/579; 307/585; 365/227
[58] Field of Search ............ 307/200 B, 443, 451, 307/452, 469, 296 R, 481, 579, 585, 264, 574, 304; 365/226-227

[56] References Cited

U.S. PATENT DOCUMENTS

| 4,442,481 | 4/1984 | Brahmbhatt | 363/60 |
| 4,565,932 | 1/1986 | Kuo et al. | 365/226 |

OTHER PUBLICATIONS

"Programmable Logic Circuit", Suwa et al.
Patent Abstracts of Japan, Denki, G11C17/00F 4P.
Gerber et al., "Low-Voltage Single Supply CMOS Electrically Erasable Read-Only Memory," IEEE Transactions on Electron Devices, vol. ED-27, No. 7, Jul. 1980.

Primary Examiner—Stanley D. Miller
Assistant Examiner—M. R. Wambach
Attorney, Agent, or Firm—Finnegan, Henderson, Farabow, Garrett & Dunner

[57] ABSTRACT

A semiconductor integrated circuit which has a CMOS inverter formed of p- and n-channel MOSFETs, and a D-type n-channel MOSFET coupled at the gate to the output terminal of the CMOS inverter, having one end coupled to a high voltage terminal and the other end coupled to the drain of the p-channel MOSFET.

14 Claims, 20 Drawing Figures

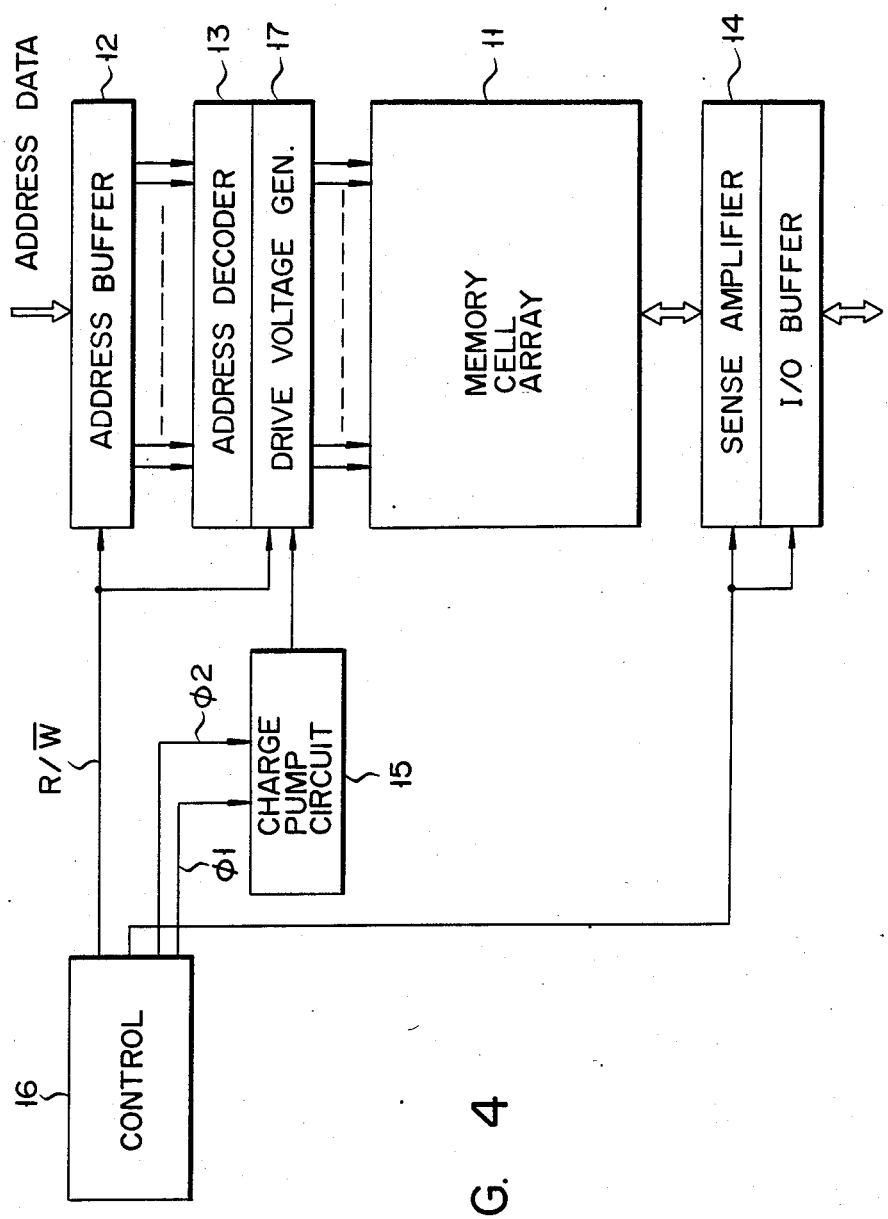
F I G. 4

F I G. 11
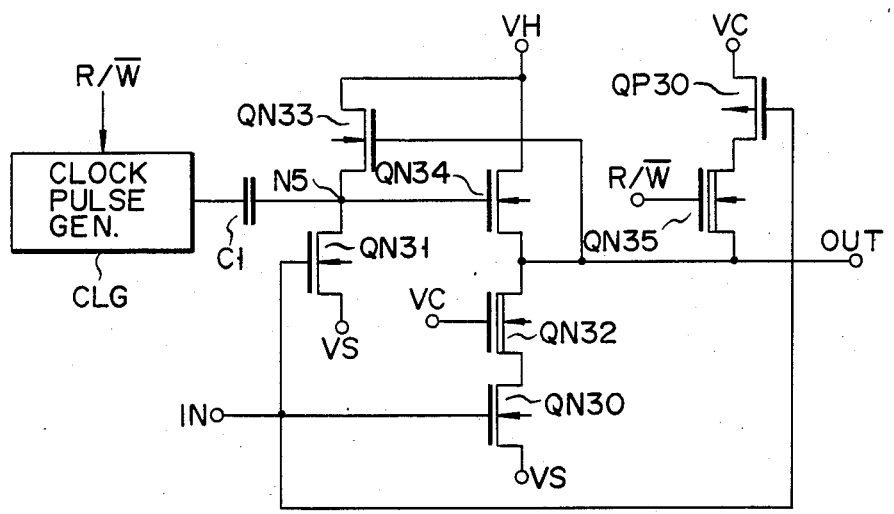
F I G. 12
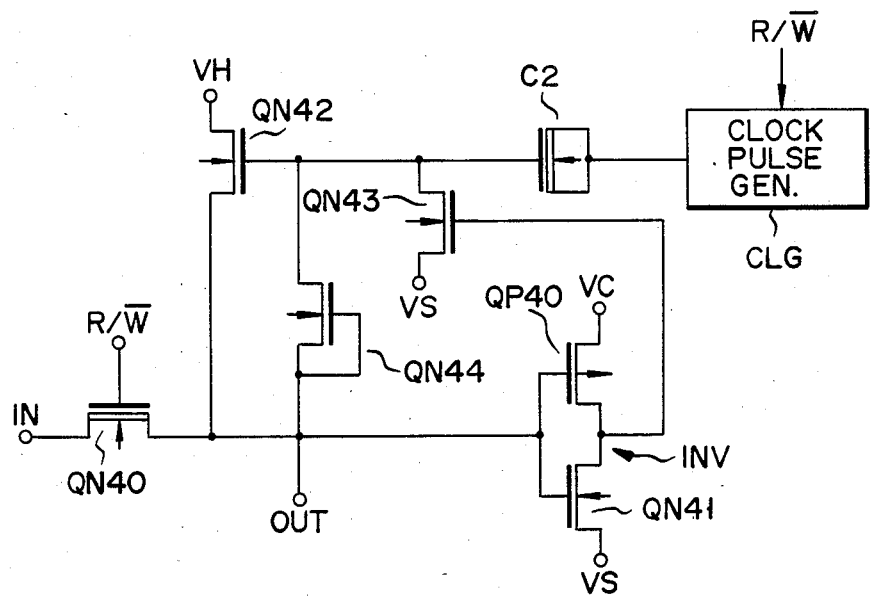

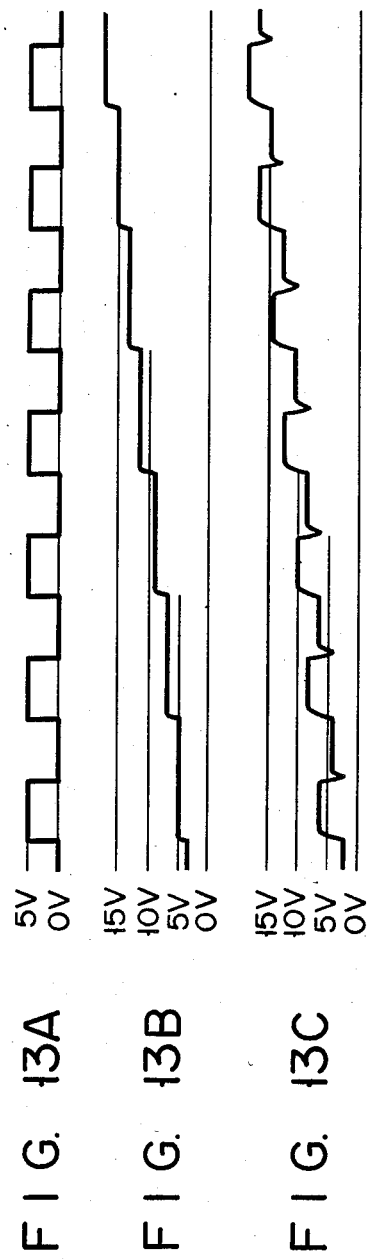
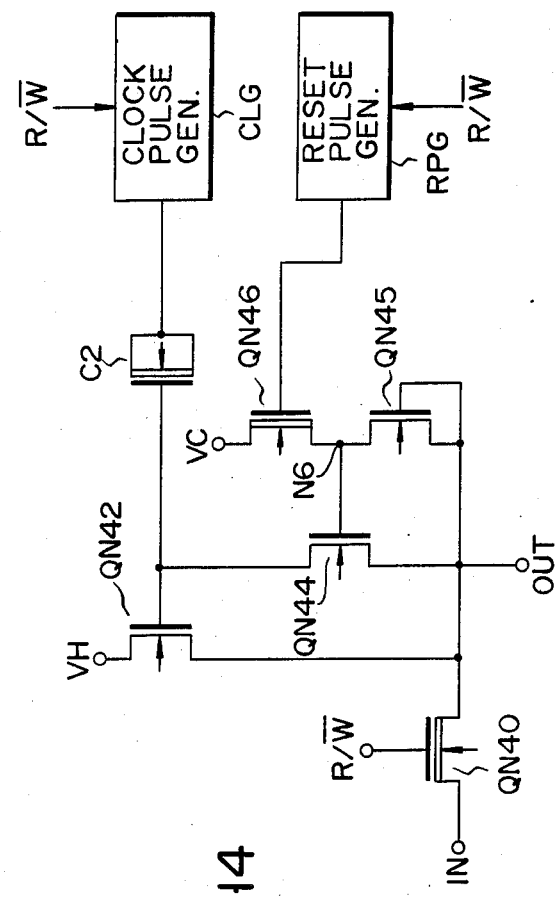
F I G. 13A
F I G. 13B
F I G. 13C
F I G. 14

READ/WRITE CONTROL CIRCUIT

BACKGROUND OF THE INVENTION

The present invention relates to a semiconductor integrated circuit which selectively supplies a high voltage in response to an input control signal.

An electrically erasable and programmable read only memory (E²PROM) which has a floating gate and a control gate to electrically rewrite the stored content has recently prevailed instead of a conventional ultraviolet ray erasable semiconductor memory. The electric rewriting of this memory is executed by injecting electrons to a floating gate by a tunnel effect through an extremely thin oxidized film or by emitting, on the other hand, electrons from the floating gate. A writing voltage higher than a reading voltage, applied at a reading time, is required at the rewriting time utilizing a tunnel current, but, in this case, almost no electric power is consumed. Thus, a voltage-boost circuit (charge pump circuit) is provided in a chip to internally generate a high voltage different from that at the reading time, thereby writing at this high voltage and erasing. Since this necessitates only a sole power source of, for example, 5 volts as an external power source, a user can very readily handle it.

An example of a memory cell of such an E²PROM is shown in FIGS. 1A to 1D. FIG. 1A shows a plan view, and FIGS. 1B to 1D are sectional views, respectively, taken along the lines B—B, C—C and D—D in the E²PROM shown in FIG. 1A. This E²PROM has an n+-type drain 2 formed in the surface region of a p-type Si substrate, an n³⁰-type source 3 formed in the surface region of a p-type Si substrate, a floating gate 4 formed through a thin gate oxidized film 5 on a channel region, and a control gate 6 formed through a gate oxidized film 7 on the floating gate 4. As shown in FIG. 1D, part of the floating gate 5 is extended through an extremely thin oxidized film 8 on an n+-type layer extended from the drain 2 to form a rewriting region.

A principle of the operation of the memory cell is as follows: In the writing operation, the drain 2 and the source 3 are maintained at a zero voltage, a high voltage is applied to the control gate 6 to raise the voltage of the floating gate 4 by capacitive coupling, and electrons from the n+-type drain 2 are injected to the floating gate 4 through the extremely thin oxidized film 8 in the rewriting region. In the erase operation, the control gate 6 is maintained at zero voltage, a high voltage is applied to the drain 2, and the electrons of the floating gate 4 are emitted into n+-type drain 2. Since the threshold voltage of the memory cell becomes high even if a voltage of 5 volts is, for example, applied as a reading voltage to the control gate 6 in when electrons are injected to the floating gate 4, the memory cell does not turn ON. When the reading voltage of 5 volts is applied to the control gate 6 when the electrons are not stored in the floating gate 4, the memory cell turn ON. Thus, the memory cell selectively stores data "1" or "0".

Such memory cells are arranged in row and column directions in a matrix, the control gates are, for example, commonly connected in the row direction, and the drains and sources are commonly connected in the column direction to compose a memory cell array. In order to produce a high voltage for programming (writing and erasing) by stepping up a power source voltage in a chip, a charge pump circuit as shown in FIG. 2 is, for example, employed.

This charge pump circuit has n stages of step-up section coupled between a load MOSFET QR and an output terminal VO, and a depletion type MOSFET QX coupled between a power source terminal VC and the output terminal VO. Each stage of the step-up section has one of MOSFETs Q1 to Qn, and one of capacitors C1 to Cn coupled at one end to the gate and the drain of this MOSFET. A clock pulse $\phi 1$ shown in FIG. 3(A) is applied to the other terminals of the capacitors in the odd-numbered stages of the step-up sections, and a clock pulse $\phi 2$ having a predetermined phase difference from the clock pulse $\phi 1$, shown in FIG. 3(B) is applied to the other terminals of the capacitors in the even stages.

In this charge pump circuit, a high voltage, for example, 20 volts is obtained at the output terminal VO by sequentially repeating the operation such that the charge stored in the capacitor C1 through the load MOSFET QR from the power source VC is transferred to the next capacitor C2 through the MOSFET Q1 by applying the clocks $\phi 1$, $\phi 2$ as shown in FIG. 3 and the charge of this capacitor C2 is transferred to the next capacitor C3 through the MOSFET Q2.

When such a charge pump circuit is rewritten by applying a high voltage to a selected row of a memory cell array in combination with an address decoder, the following problem arises. There is no trouble in the supply of the high voltage, thus stepped-up, to the control gate of the row selected because the output of the address decoder becomes high. As the charge pump circuit in FIG. 2 utilizes the charge stored in the capacitor, the current supplying ability of the capacitor is extremely low. When the outputs of the address decoders are at a low level in the remaining rows not selected, the current from this charge pump circuit must not flow out through the output stage. If the above-described current flowout occurs in the rows not selected, a sufficient high voltage cannot be applied to the row thus selected.

SUMMARY OF THE INVENTION

It is an object of the present invention to provide a semiconductor integrated circuit capable of suppressing the current flowout from a charge pump circuit to a minimum and supplying a sufficiently stepped-up voltage to a memory cell array, thereby improving the reliability of the memory cell array.

In order to achieve the above and other objects, there is provided according to the present invention a semiconductor integrated circuit comprising a switching circuit coupled between a high voltage terminal supplied with a voltage higher than a power source voltage and an output terminal, and a control circuit for controlling the transmission of a high voltage applied to the high voltage terminal to the output terminal by controlling the conduction state of the switching circuit.

According to one aspect of the present invention, the control circuit is, for example, composed of an inverter. Therefore, a semiconductor integrated circuit which has a simple arrangement and can suppress the current consumption to the minimum can be provided.

BRIEF DESCRIPTION OF THE DRAWINGS

FIG. 4 is a block diagram of a memory device using a semiconductor integrated circuit according to an embodiment of the present invention;

FIGS. 11 and 12 are circuit diagrams respectively showing semiconductor integrated circuits having functions for increasing step by step the output voltages by using capacitors;

FIGS. 13A to 13C are voltage waveform diagrams for describing the operation of the circuit shown in FIG. 12; and FIG. 14 is a circuit diagram showing a semiconductor integrated circuit according to still another embodiment of the present invention.

DETAILED DESCRIPTION OF THE PREFERRED EMBODIMENTS

The present invention will now be described in more detail with reference to the accompanying drawings.

Figure 1A:
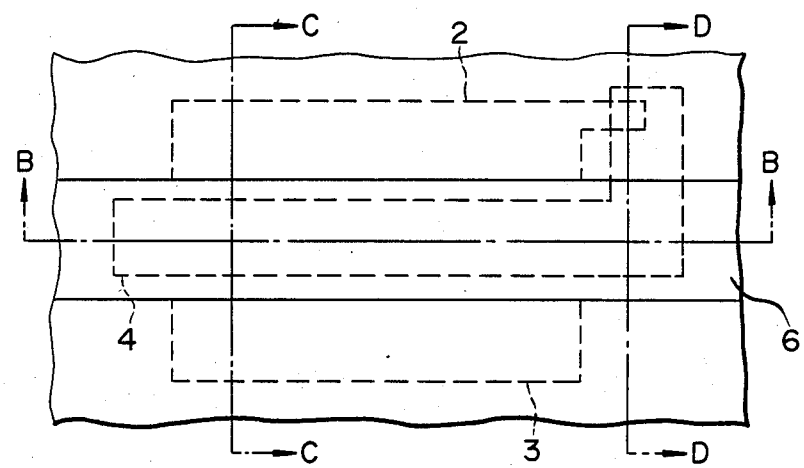
FIG. 1A is a plan view of a memory cell having a conventional floating gate.
Figure 1B:
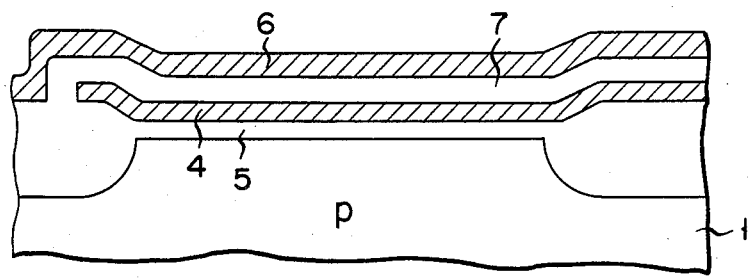
FIGS. 1B to 1D are sectional views showing the constructions of the memory cell taken along the lines B—B, C—C and D—C in FIG. 1A.
Figure 1C:
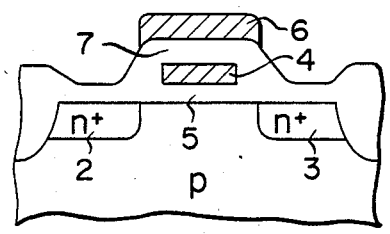
Figure 1D:
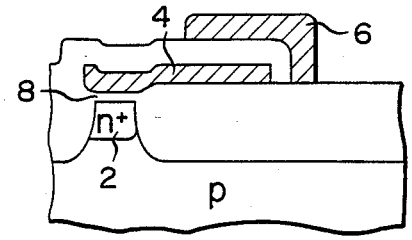
Figures 2, 3A, 3B:
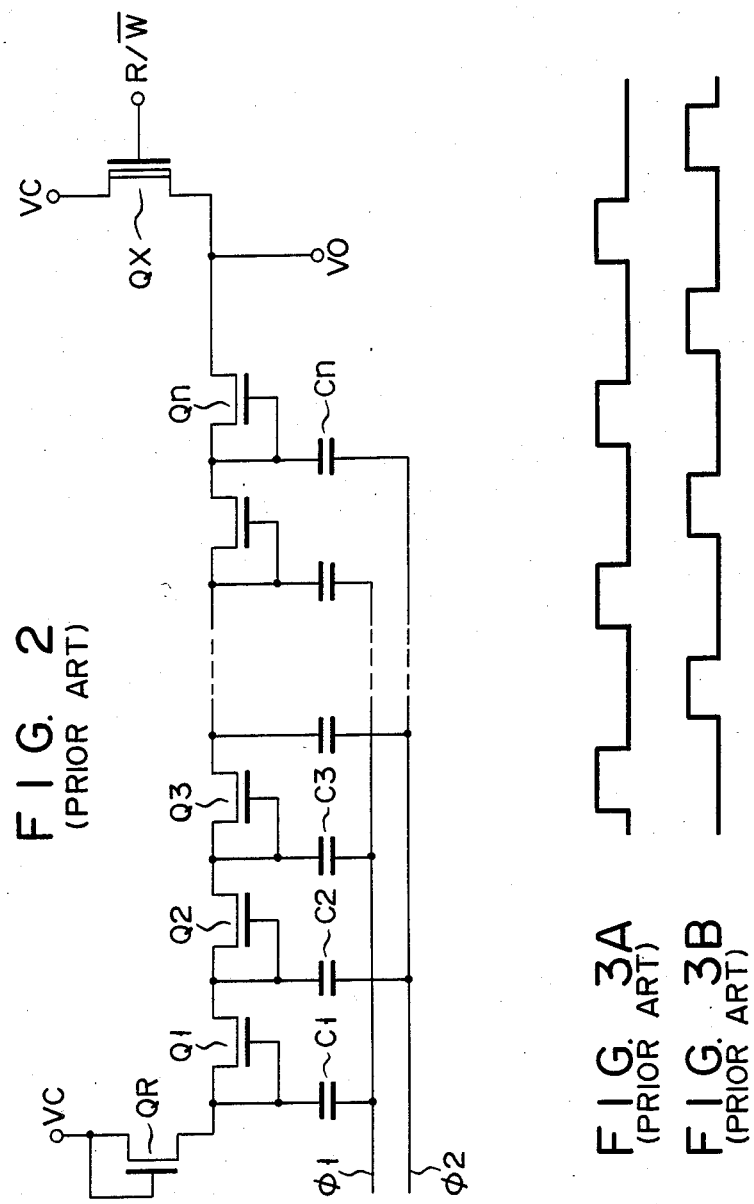
FIG. 2 is a circuit diagram showing a charge pump circuit for selectively generating a step-up voltage and a power source voltage.
FIGS. 3a and 3b are waveform diagrams of drive pulses for driving the charge pump circuit shown in FIG. 2.

FIG. 4 shows a semiconductor memory device using a semiconductor integrated circuit according to an embodiment of the present invention. This semiconductor memory device comprises a memory cell array 11, an address buffer 12, an address decoder 13, an I/O circuit 14 including an I/O buffer and a sense amplifier, a charge pump circuit 15 for generating high level voltage and a control circuit 16 for controlling the operations of these units and circuits. A semiconductor memory device having these constituents 11 to 16 is heretofore known. The memory cell array described with reference to FIGS. 1A to 1D and arranged in a matrix form, and the charge pump circuit 15 has the circuit as shown in FIG. 2. The aspect of the semiconductor memory device of FIG. 4 that is different from the conventional one is that a step-up drive voltage generation circuit 17 is provided at the output terminal of the address decoder 13. This step-up drive voltage generation circuit 17 is operated to supply a high voltage (e.g., VH=20 volts) stepped up from a power source voltage in case of rewriting, to supply a reading voltage substantially equal to the power source voltage in case of reading, to the selected row of the memory cell array 11 in the case that the output of the decoder 13 is "1", and to supply zero voltage without outputting a current to the remaining nonselected rows in the case that the output of the decoder 13 to "0".

Figure 5:
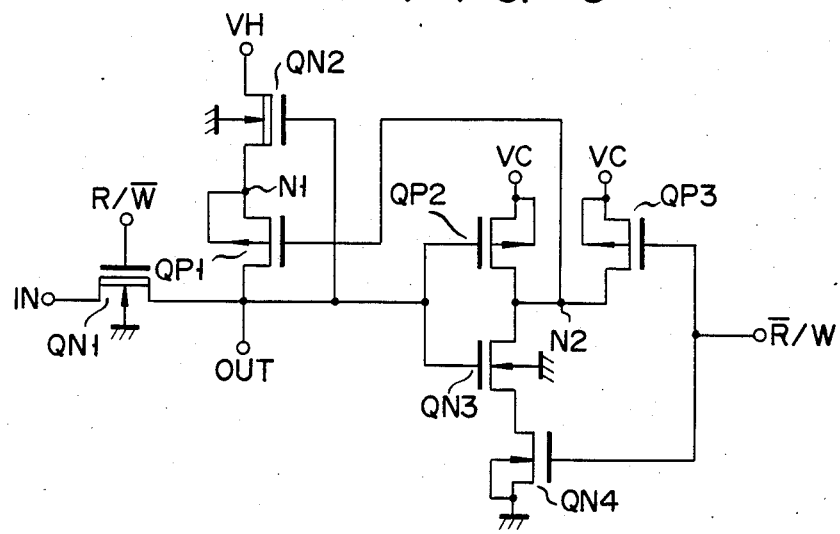
FIG. 5 is a circuit diagram of a semiconductor integrated circuit according to an embodiment of the present invention.

An example of a concrete construction of the step-up drive voltage generation circuit 17 is shown in FIG. 5. FIG. 5 shows a unit circuit section connected to one output terminal of the decoder 13, and similar circuits are respectively provided at the output terminals of the decoder 13. In other words, an input terminal IN is a terminal connected to one output terminal of the decoder 13, and an output terminal OUT is a terminal for supplying a selected signal voltage to the control gate of the selected row of the memory cell array 11. An n-channel depletion type (D-type) MOSFET QN1 controlled by a read/write control signal R/$\overline{W}$ is provided as a transfer gate between the input terminal IN and the output terminal OUT. The output voltage of the charge pump circuit 15 is supplied to a step-up voltage (high voltage) receiving terminal VH, and a p-channel enhancement type (E-type) MOSFET QP1 and an n-channel D-type MOSFET QN2 are connected in series between the output terminal OUT and the step-up voltage receiving terminal VH. A substrate of the MOSFET QP1 is connected to a connecting node N1 between these MOSFETs QP1 and QN2, and the gate of the MOSFET QN2 is coupled to the output terminal OUT. On the other hand, the output terminal OUT is connected to the input terminal of a CMOS inverter having an n-channel E-type MOSFET QN3 and a p-channel E-type MOSFET QP2, and the output node N2 of the CMOS inverter is coupled to the gate of the MOSFET QP1. An n-channel E-type MOSFET QN4 is provided in series with the MOSFET QN3 at the ground side of the CMOS inverter, a p-channel E-type MOSFET QP3 is provided in parallel with the MOSFET QP2 at the power source VC side, and the gates of these MOSFETs QN4 and QP3 are controlled by an inverted signal $\overline{R/W}$ of the read/write control signal R/$\overline{W}$.

The operation of the circuit shown in FIG. 5 will be described. The threshold value of the n-channel D-type MOSFETs QN1 and QN2 is $-3$ volts, the threshold value of the n-channel E-type MOSFETs QN3 and QN4 is 1 volt, and the threshold value of the p-channel E-type MOSFETs QP1, QP2 and QP3 is $-1$ volt.

The writing mode will be first described. R/$\overline{W}$=5 volts and $\overline{R/W}$=0 volt are applied in the writing mode, and a step-up voltage of 20 volts is supplied from the charge pump circuit 15 to the terminal VH. Assume now that the input terminal IN is 5 volts, i.e., the output of the decoder is "1" level, a voltage of approx. 3 volts is presented at the output terminal OUT according to the threshold value of the MOSFET QN1. Thus, a gate voltage of 3 volts is applied to the gate of the MOSFET QN2, and approx. 6 volts is presented at the node N1. On the other hand, since $\overline{R/W}$=5 volts, the MOSFET QN4 is ON and the MOSFET QP3 if OFF, the CMOS inverter is operated, the voltage of the output terminal OUT is inverted by the CMOS inverter, the output node N2 becomes zero volts, and the MOSFET QP1 thus becomes ON. As a result, the voltage of the node N1 is transmitted to the output terminal OUT. Sine the MOSFET QN1 becomes OFF when the voltage of the output terminal OUT rises to 3 volts or higher, a current does not flow from the stepped-up output terminal OUT to the input terminal IN. Thus, the voltage of 20 volts of the output terminal OUT is applied to the control gate of the selected row of the memory cell array 1, thereby writing data in the memory cell in accordance with the data input from the I/O circuit 14.

Then, since R/$\overline{\text{W}}$=0 volt when the output of the decoder is "0" level, i.e., the input terminal IN is 0 volt, a voltage on the output terminal OUT is not stepped up, the output node N2 of the CMOS inverter is 5 volts, the MOSFET QP1 is maintained in OFF state, and the stepped-up voltage VH is not transmitted to the output terminal OUT. Therefore, no current is flowed from the charge pump circuit 15 to the output stage of the decoder having the output "0".

Next, the reading mode will be described. It is necessary to supply an output voltage corresponding to the input voltage of 5 to 0 volt applied to the input terminal IN to the output terminal OUT. In the reading mode, the MOSFET QX is turned ON, the charge pump circuit 15 does not generate a step-up voltage, and a power source voltage of 5 volts is supplied to the terminal VH. When the voltage on the input terminal IN is 5 volts, since it becomes R/$\overline{\text{W}}$=5 volts at this time, no voltage drop occurs in the MOSFET QN1, and this is transmitted to the output terminal OUT. Further, when the input terminal IN is 0 volts. 0 volts appears at the output terminal OUT. Since the MOSFET QN4 is OFF and the MOSFET QP3 is ON due to the $\overline{\text{R/W}}$=0 volt, the output node N2 of the CMOS inverter is 5 volts irrespective of the voltage of the output terminal OUT, the MOSFET QP1 thus assumes the OFF state, and the voltage of the terminal VH is not presented at the output terminal OUT.

Thus, the voltage of 5 volts is supplied to the control gate in the row selected by the decoder 13 to read information.

Figure 6:
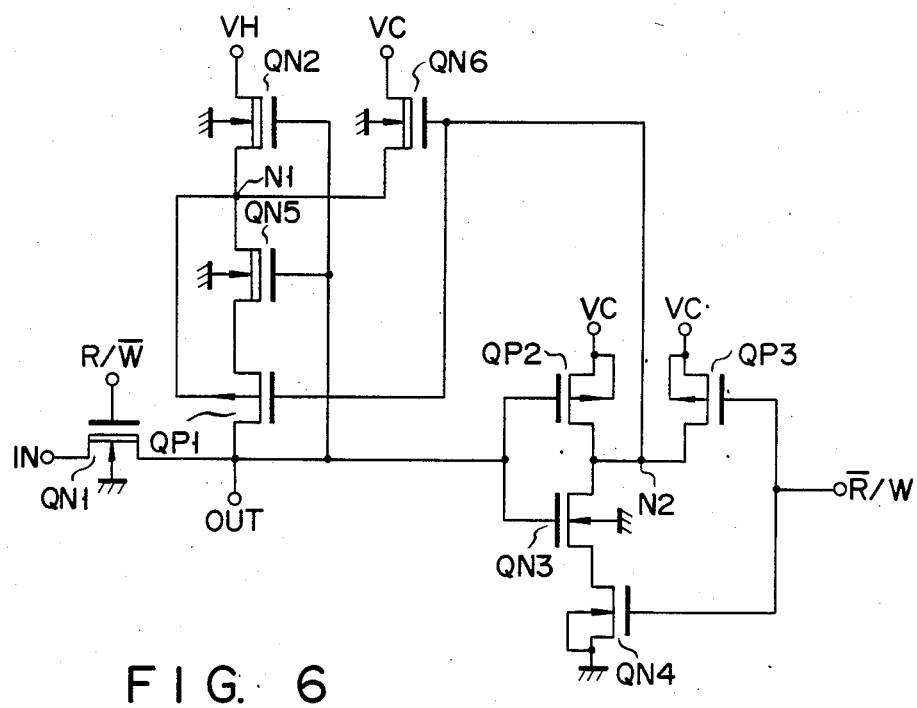
FIG. 6 is a circuit diagram of a modified embodiment of the circuit shown in FIG. 5.

FIG. 6 shows a modified embodiment intended to stabilize the operation of the unit circuit in FIG. 5. The differences from the embodiment in FIG. 5 are that an n-channel D-type MOSFET QN5 is inserted between the node N1 and the MOSFET QP1, and an n-channel D-type MOSFET QN6 is inserted between the node N1 and the power source VC.

Since the fundamental operation of this circuit is not different from that in FIG. 5, only the operations of the MOSFETs QN5 and QN6 will be described. When altering from the reading mode to the writing mode, the terminal VH is at the step-up voltage of 20 volts, and when the input terminal IN varies from 5 volts to 0 volt, a DC current flows from the terminal VH to the input terminal IN in the case that the MOSFET QN1 instantaneously varies from 5 volts to 0 volt. The MOSFET QN5 suppresses the flowout of the DC current in this transient state. Thus, it can prevent the step-up voltage supplied to the output terminal OUT from decreasing when the input terminal IN becomes 5 volts.

If the voltage of the terminal VH does not sufficiently decrease for example to approximately 10 volts, when altering from the writing mode to the reading mode, the application of the voltage to the output terminal OUT causes an erroneous operation. At this time the MOSFET QN6 switches ON under the control of the output node N2 of the CMOS inverter, and even if the voltage of the terminal VH is high, the high voltage is not applied to the output terminal OUT by clamping the voltage of the node N1 to the power source VC.

Since the output node N2 of the CMOS inverter is at 0 volts, i.e., the MOSFET QN6 is in the OFF state in the writing mode using the step-up voltage of 20 volts, no current flows from the terminal VH to the power source VC through this MOSFET QN6.

Figure 7:
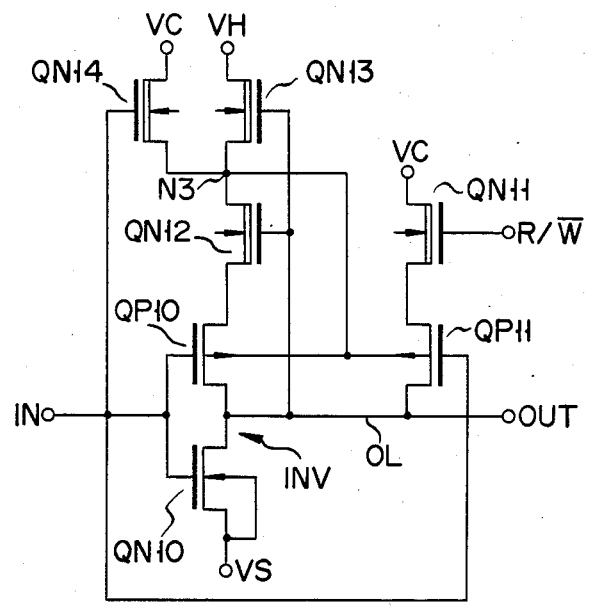
FIG. 7 is a circuit diagram of a semiconductor integrated circuit according to another embodiment of the present invention.

FIG. 7 shows a semiconductor integrated circuit according to another embodiment of the present invention. This circuit has a p-channel MOSFET QP10 and an n-channel MOSFET QN10 forming a CMOS inverter INV, and the drains of which are coupled to an output terminal OUT, and a D-type n-channel MOSFET QN11 and a E-type p-channel MOSFET QP11 coupled in series between the power source terminal VC and the output terminal OUT. The source of the MOSFET QN10 is coupled to ground terminal VS, and the source of the MOSFET QP10 is coupled to high voltage terminal VH coupled to the output terminal of a charge pump circuit shown in FIG. 2 in series through D-type n-channel MOSFETs QN12 and QN13. The node N3 between the MOSFETs QN12 and QN13 is coupled to the power source terminal VC through a D-type n-channel MOSFET QN14.

The gates of the MOSFETs QP10, QP11, QN10 and QN14 are coupled to an input terminal IN, the gates of the MOSFETs QN12 and QN13 are coupled to the output terminal OUT, and the gate of the MOSFET QN11 is coupled to receive a control signal R/$\overline{\text{W}}$. Further, the back gates (the substrate) of the MOSFETs QP10 and QP11 are coupled to the node N3.

The operation of the circuit thus constructed will be described. It is first considered the case that the control signal R/$\overline{\text{W}}$ is "0" level, i.e., data is to be written into a memory cell to which the output signal from this circuit is supplied. In this case, a high voltage is applied to the high voltage terminal VH. When the input signal applied to the input terminal IN is set to "0" level (an earth voltage $V_s$=0 volt) in this state, the MOSFET QP10 in the inverter INV becomes ON, and the MOSFET QN10 becomes OFF. After a high voltage of 20 volts is, on the other hand, applied to the high voltage terminal VH, the node N3 is charged toward the 20 volts through the MOSFET QN13. At this time, the gate of the MOSFET QN14 becomes "0" level (0 volt), and the voltage $V_c$ of 5 volts is applied to the source of the MOSFET QN14, and the gate voltage of the MOSFET QN14 is set to −5 volts with respect to the source of the MOSFET QN14. Assume now that the absolute value of the threshold voltage of the MOSFET QN14 is set to 5 volts or lower (also similar in the other D-type MOSFETs), this MOSFET QN14 becomes OFF. Thus, the node N3 charged toward the step-up voltage of 20 volts through the MOSFET QN13 is not discharged by the MOSFET QN14. Therefore, the output terminal OUT is charged toward the step-up voltage of 20 volts through the MOSFET QN12 and the MOSFET QP10. Thus, the MOSFETs QN12 and QN13, the gates of which are connected to an output line OL, are lowered in the impedances between the sources and the drains thereof, and the output line OL is charged toward the step-up voltage of 20 volts. Since the MOSFET QN11 is turned OFF by the control signal R/$\overline{\text{W}}$ of "0" volt at this time, the output terminal OUT is not discharged toward the power source voltage through the two MOSFETs QP11 and QN11.

As described above, when the input signal is set to "0" level, a voltage near the step-up voltage is obtained as the output signal. In the memory cell whose control gate is connected to receive this output signal, data is written. When the step-up voltage is obtained as the output signal, the flowout of the current from the high voltage terminal VH, to which the step-up voltage is applied, may be only for charging the output line OL, and the ordinary flowout of the current does not occur.

On the other hand, assume that the input signal becomes "1" ($V_c$=5 volts) this time when the control signal R/W̄ is "0" level. In this case, the MOSFET QN10 becomes ON. When the MOSFET QN10 becomes ON, the output line OL is discharged toward the earth voltage $V_s$, and the output signal is set to "0" level. On the other hand, when the input signal is set to "1" level, the MOSFET QN14 is turned ON, and the node N3 is charged to 5 volts. Since the gate of the MOSFET QN13 is set to the earth voltage $V_s$, i.e., 0 volt, the gate voltage with respect to the source side of the MOSFET QN13 which uses the node N3 side as its source is set to −5 volts. Thus, the MOSFET QN13 is cut off. Since the back gates of the two p-channel MOSFETs QP10 and QP11 are connected to the node N3 charged to 5 volts, both MOSFET QP10 and QP11 are cut off.

When the input signal is set to "1" level in this manner, the earth voltage $V_s$, i.e., 0 volt is obtained as the output signal. In the memory cell, to which the voltage is applied to the control gate, no variation in the threshold voltage occurs. When 0 volt is obtained as the output signal, the flowout of the current from the high voltage terminal VH becomes only the leakage current.

More specifically, when a high voltage is applied to the high voltage terminal VH and this high voltage is outputted in response to the input signal, the flowout of the current from the high voltage terminal VH is only for temporarily charging the capacity existing in the output line, and the ordinary flowout of the current is prevented.

Next the case where data is read out in the memory cell, not shown, to which the output signal from this circuit is supplied will be discussed. In this case, the control signal R/W̄ is set to "1" level. The ordinary voltage $V_c$ of 5 volts is applied to the high voltage terminal VH instead of the high voltage of 20 volts. When the input signal is set to "0" level in this state, the output line OL is charged to 5 volts in series through the MOSFETs QN13, QN12 and QP10. Since the control signal R/W̄, on the other hand, switches "1", the MOSFET QN11 becomes ON. Further, the MOSFET QP11 is also switched ON by the input signal. Thus, the output line OL is charged also through the MOSFETs QN11 and QP11. The reasons for charging the output line OL through the two routes are as follows: When the input signal is switched from "1" level to "0" level or vice versa when the high voltage of 20 volts is applied to the high voltage terminal VH, a penetrating current might temporarily take place between the high voltage terminal VH and the ground terminal VS, with the result that the high voltage might decrease to extremely low level. Thus, the MOSFET QN12 is provided so as to reduce the value of the above-described penetrating current as low as possible. Thus, the charging ability of the output line OL due to the connections of the MOSFETs QN13, QN12 and QP10 is not sufficient. Therefore, the charging operation is also conducted through the connections of the MOSFETs QN11 and QP11 so as to abruptly charge the output line OL to 5 volts.

On the other hand, since the MOSFET QN10 switches ON and the MOSFET QP11 switches OFF when the input signal is "1" level, the output line OL is discharged to 0 volt.

In other words, when the control signal R/W is set to a "1" level, the output signal from this circuit is set to 5 volts or 0 volts in response to the input signal. When the output signal is set to 5 volts, the memory cell, which has as an input to its control gate the output signal of 5 volts, is set in the selected state, and supplies data previously stored therein. The memory cell which has the output signal 0 volts applied to its control gate is set in the nonselected state.

According to the circuit of the embodiment of the invention as described above, the step-up voltage can be supplied to the control gate of the memory cell without the ordinary flowout of the current from the high voltage terminal VH. Further, the value of the temporary penetrating current generated when the input signal is switched can be sufficiently reduced.

Figure 8:
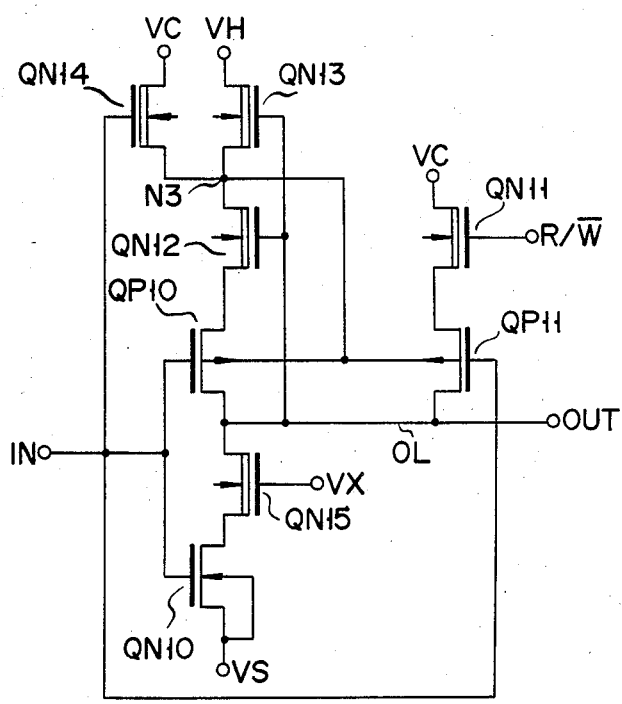
FIG. 8 is a circuit diagram showing a modified embodiment of the present invention shown in FIG. 7.

FIG. 8 is a circuit diagram showing a semiconductor integrated circuit according to still another embodiment of the present invention. The difference from the the embodiment in FIG. 7 is that a D-type n-channel MOSFET QN15 is connected between an output line OL and an n-channel MOSFET QN10. A predetermined voltage VX higher than 0 volt is applied to the gate of this MOSFET QN15. In the circuit of this embodiment, the direct application of a high voltage to the MOSFET QN10 is prevented by the MOSFET QN15. The reason why a voltage higher than 0 volt is applied to the gate of the MOSFET QN15 is that the breakdown voltage of the MOSFET QN10 becomes lowest when the voltage of the gate is 0 volt. Thus, the voltage of higher than 0 volt is applied to the gate of the MOSFET QN15 to step up the breakdown voltage of the MOSFET QN15, and the direct application of the high voltage to the drain of the MOSFET QN10 is prevented.

Figure 9:
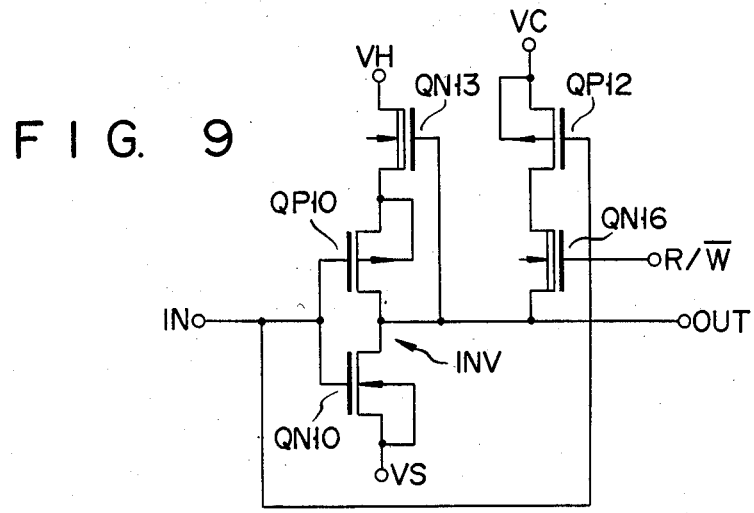
FIG. 9 is a circuit diagram showing a semiconductor integrated circuit according to still another embodiment of the present invention.

FIG. 9 is a circuit diagram showing a semiconductor integrated circuit according to still another embodiment of the present invention. In the circuit of this embodiment, the two MOSFETs QN12 and QN14 in FIG. 7 are omitted, and the source of the MOSFET QN13 is connected directly to the source of the MOSFET QP10. Further, the back gate of the MOSFET QP10 is connected to its own source instead of the connection to the node N3. Moreover, an E-type p-channel MOSFET QP12 and a D-type MOSFET QN16 are connected in series between a power source terminal VC and an output line OL instead of the two MOSFETs QN11 and QP11, the gate of one MOSFET QP12 is coupled to an input terminal IN, and a control signal R/W̄ is applied to the gate of the other MOSFET QN16.

When the input signal is set to "0" level the control signal R/W̄ is at the "0" level; and a high voltage is applied to the high voltage terminal VH in the circuit arrangement described above, the MOSFET QN10 switches OFF, and the output line OL is charged toward the step-up voltage in series through the two MOSFETs QN13 and QP10. More particularly, a high voltage is output as the output signal from the output terminal OUT. On the other hand, when the input signal is set to "1" level (5 volts), the MOSFET QN10 becomes ON, and the output line is discharged to ground level. At this time, the gate voltage of the MOSFET QN13 is 0 volt, and when the source voltage of the MOSFET QP10 is charged to the voltage VT1 corresponding to the absolute value of the threshold voltage of the MOSFET QN13, the MOSFET QN13 is cut off. On the other hand, the gate voltage of the MOSFET QP10 is 5 volts at this time, and this back gate is connected to the source of the MOSFET QP10. Thus, if the sum of the source voltage VT1 of this MOSFET QP10 and the threshold voltage of the MOSFET QP10 is set to "1" level of the input, i.e., 5 volts or lower, the MOSFET QP10 is cut off. In other words, in this embodiment as well, the flowout of the ordinary current from the high voltage terminal VH can be prevented. In FIG 9, the backgate of MOSFET QP10 can be connected to the high voltage terminal VH instead of the source of the MOSFET QP10.

When the control signal R/$\overline{W}$ is set to "1" level in the circuit of this embodiment, the output line OL is charged or discharged mainly by the p-channel MOSFET QP12 and the n-channel MOSFET QN10 controlled to ON or OFF in response to the input signal to set the output signal to 5 volts or 0 volt.

Figure 10:
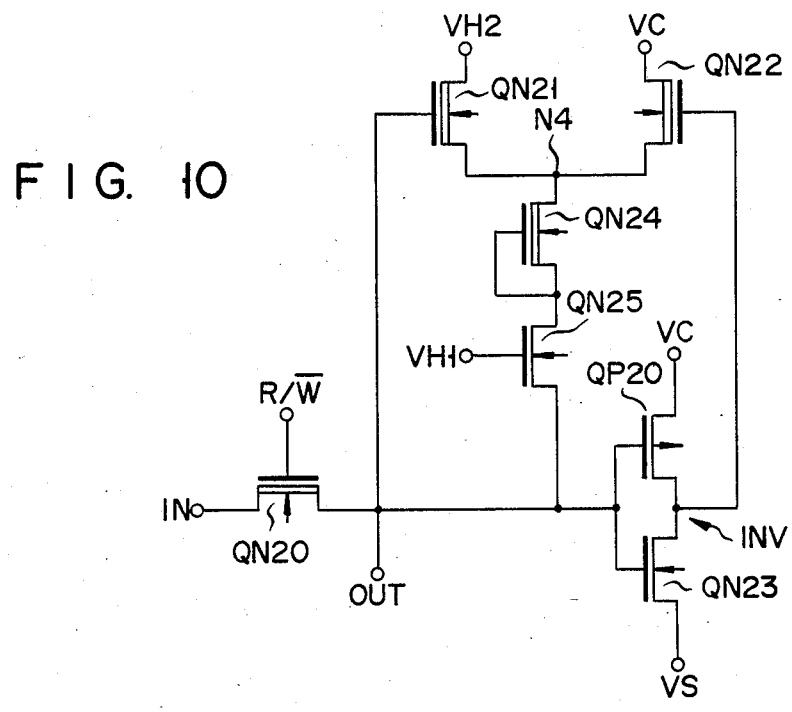
FIG. 10 is a circuit diagram showing a semiconductor integrated circuit according to still another embodiment of the present invention.

FIG. 10 shows a semiconductor integrated circuit according to still another embodiment of the present invention. This circuit comprises a D-type n-channel MOSFET QN20 coupled between an input terminal IN and an output terminal OUT, D-type n-channel MOSFETs QN21 and QN22 coupled at the sources thereof to a node N4, E-type p-channel and n-channel MOSFETs QP20 and QN23 forming a CMOS inverter INV, and D-type n-channel MOSFET QN24 and E-type n-channel MOSFET QN25 coupled in series between the node N4 and the output terminal OUT. The gates of the MOSFETs QN21, QN23 and QP20 are coupled to the output terminal OUT, and the gate of the MOSFET QN22 is coupled to the drains of the MOSFETs QP20 and QN23. The gate of the MOSFET QN24 is coupled to its own source, and a first step-up voltage terminal VH1 is coupled to the gate of the MOSFET QN25. A second step-up terminal VH2 and a power source terminal VC are respectively coupled to the drains of the MOSFETs QN21 and QN22. A signal R/$\overline{W}$ which becomes "1" level at reading time and "0" level at step-up operation time such as at writing and erasing times is applied to the gate of the MOSFET QN20. The MOSFETs QN21 and QN22 form a first switching circuit, and the MOSFET QN25 forms a second switching circuit.

Next, the operation of the semiconductor integrated circuit in FIG. 10 will be described. At the step-up operation time, such as at the writing or erasing time, a high voltage (e.g., 20 volts) is first supplied to the high voltage terminals VH1 and VH2, the control signal R/$\overline{W}$ becomes "0" level (e.g., 0 volt), the voltages of the input terminal IN and the output terminal OUT are independent from each other, and can be set. When the input signal is "1" level, e.g., 5 volts in this case, a "1" level signal is output to the output terminal OUT. Since the output signal of the inverter INV thus becomes "0", the MOSFET QN22 becomes OFF, the MOSFET QN21 becomes ON, and the step-up voltage of the high voltage terminal VH2 is output to the output terminal OUT through the MOSFETs QN21, QN24 and QN25. In this state, if the MOSFET QN20 is at the gate voltage 0 volt, at the source voltage or the input signal, for example, 5 volts, and the threshold value of the MOSFET QN20 is −5 volts or higher, the MOSFET QN20 is cut off. Thus, no current is leaked through the MOSFET QN20. When the input signal is "0" level, the signal output terminal OUT becomes "0" level, and the output signal of the inverter INV becomes "1" level, so that the MOSFET QN22 becomes ON and the MOSFET QN21 becomes OFF, with the result that substantially power source voltage (e.g., 5 volts) is outputted to the node N4. Since the MOSFET QN21 is cut off because the gate voltage is 0 volt and the source voltage is approximately 5 volts, no current is leaked through the MOSFET QN21.

At a time other than step-up operation time such as at reading time, the step-up terminal VH2 becomes substantially the power source voltage, the step-up terminal VH1 becomes "0" level, and the control signal R/$\overline{W}$ becomes "1" level. Since the high voltage terminal VH1 is 0 volt, the MOSFET QN25 switches OFF, the passage of the current from the high voltage terminal VH2 and the power source terminal VC to the signal output terminal OUT is completely interrupted, and "1" or "0" level output signal is accordingly produced at the signal output terminal OUT in response to the input signal to the input terminal IN.

When this decoder circuit (FIG. 10) is used, for example, as a row decoder, signal output terminals OUT correspond to row lines, 120 or 130 to 600 or 700 decoders are required according to the capacity of the memory, no leakage current is produced from the power source terminal VC at the reading time, the current consumption can be suppressed to the minimum, and the circuit can be readily associated in a circuit for the purpose of reducing the current at the operation time like a CMOS circuit.

FIG. 11 shows a semiconductor integrated circuit according to still another embodiment of the present invention. This circuit comprises n-channel MOSFETs QN30 and QN31 as well as p-channel MOSFET QP30 coupled at the gates to an input terminal IN, a D-type n-channel MOSFET QN32 coupled between the drain of the MOSFET QN30 and an output terminal OUT, an n-channel MOSFET QN33 coupled between the drain of the MOSFET QN31 and a high voltage terminal VH, an n-channel MOSFET QN34 coupled between the output terminal OUT and the high voltage terminal VH, and a D-type n-channel MOSFET QN35 coupled between the drain of the MOSFET QP30 and the output terminal OUT. A clock pulse generator CLG is coupled to a node N5 between the MOSFETs QN31 and QN33 through a capacitor C1, and coupled to the gate of the MOSFET QN34. Further, the gates of the MOSFETs QN32 and QN33 are respectively coupled to the power source terminal VC and the output terminal OUT, and a control signal R/$\overline{W}$ is supplied to the gate of the MOSFET QN35.

In FIG. 11, in case of reading data, the control signal R/$\overline{W}$ of "1" is supplied, and an output signal from the clock pulse generator CLG becomes "0" level. In this case, a voltage equal to the power source voltage VC is supplied to the high voltage terminal VH, and the output signal of the output terminal OUT becomes "0" or "1" in response to the "1" or "0" level of the input signal to the input terminal IN.

Then, in case of writing or erasing data, the control signal R/$\overline{W}$ of "0" level is supplied, the step-up voltage (e.g., 20 volts) is applied to the high voltage terminal VH, and a clock pulse is generated from the clock pulse generator CLG. When the input signal is "1" level, a "0" level signal is generated from the output terminal OUT, but when the input signal is "0" level, the MOSFETs QN30 and QN31 become OFF, the gate voltage of "0" level is applied to the MOSFET QN35, which becomes ON due to the D-type MOSFET, MOSFET QP30 which becomes ON due to the p-channel MOSFET, and the voltage of the output terminal OUT does not become 0 volt. Therefore, after the MOSFET QN33 starts to be conductive, charge is stored in the capacitor C1, the voltage of the node N5 becomes "VCP+VCL", where VCP represents the voltage difference between the both terminals of the capacitor C1, and VCL represents the voltage of the clock pulse, the MOSFET QN34 becomes ON, the voltage of the output terminal OUT gradually rises at every clock pulse. Thus, as the output terminal OUT thus rises, the MOSFET QN33 becomes more strongly ON, and the voltage of the node N5 accordingly approaches "VCL+VCH" (where VCH represents the voltage of the terminal VH). Since the MOSFET QN34 becomes more strongly ON, the voltage of the output terminal OUT becomes VCH. At this time, the gate voltage of the MOSFET QN35 becomes "0" level, and the voltage of the drain is Vc level, and the MOSFET QN35 is completely turned OFF to prevent a current from flowing from the output terminal OUT to the power source terminal Vc.

In the circuit in FIG. 11, the current consumption in the nonselective decoder can be prevented. In other words, a "1" level signal is supplied to the input terminal IN, the MOSFET QN30 and QN31 become ON, and the gates of the MOSFETs QN33 and QN34 become "0" level. Therefore, the MOSFET QN33 and QN34 become OFF, so that the current does not pass from the high voltage terminal VH to the output terminal OUT, with the result that this high voltage decoder circuit does not consume the current. Thus, since the current consumed in the nonselective high voltage decoder becomes less, a charge pump shown in FIG. 2 for generating a high voltage is provided in a chip to be able to thereby write data and to erase the data. Since the gate voltae of the MOSFET QN34 for switching the high voltage from the charge pump circuit becomes higher in the amount corresponding to the voltage across the both terminals of the capacitor C1 than the high voltage, the ON resistance of the MOSFET QN34 becomes low, and the voltage drop at the MOSFET accordingly becomes low. Since the capacitor C1 is charged by the high voltage VCH, the rise of the output voltage of this circuit shown in FIG 11 is accelerated.

FIG. 12 shows a semiconductor integrated circuit according to still another embodiment of the present invention. This circuit comprises a D-type n-channel MOSFET QN40 coupled between an input terminal IN and an output terminal OUT, p- and n-channel MOSFETs QP40 and QN41 forming a CMOS inverter INV, an n-channel MOSFET QN42 coupled between a high voltage terminal VH and the output terminal OUT, and a clock pulse generator CLG. The output terminal of this clock pulse generator CLG is coupled to the source and the drain of a D-type n-channel MOS capacitor C2. The gate of this capacitor C2 is coupled to the gate of the MOSFET QN42. The gate of the MOSFET QN42 is coupled to a ground terminal VS through the MOSFET QN43, and to the output terminal OUT through the MOSFET QN44. The gates of the MOSFETs QP40 and QN41 are coupled to the output terminal OUT, and the gate of the MOSFET QN43 is coupled to the drains of the MOSFETs QP40 and QN41, the gate of the MOSFET QN44 is coupled to its own source, and a control signal R/$\overline{W}$ is supplied to the gate of the MOSFET QN40.

In this case, the threshold values of the E-type n-channel MOSFETs QN41, QN42, QN43 and QN44 are set to 1 volt, the threshold value of the D-type n-channel MOSFET QN40 is set to −3 volts, and the threshold value of the E-type p-channel MOSFET QN40 is set to −1 volt.

The operation of the circuit shown in FIG. 12 will be described with reference to signal waveform diagrams in FIGS. 13A to 13C.

Assume that the control signal R/$\overline{W}$ is now "0" level, i.e., the memory cell array 11 (in FIG. 2) is set to the writing mode. In this case, the step-up voltage VCH is applied to the high voltage terminal VH, and a pulse shown in FIG. 13A is generated from the clock pulse generator CLG. Assume now that 5 volts, a "1" level decoded output signal is supplied to the input terminal IN. The voltage of 3 volts is presented corresponding to the absolute value of the threshold voltage of the MOSFET QN40 at the output terminal OUT as shown in FIG. 13B. Thus, the voltage of 2 volts lower in the amount of the threshold voltage (1 volt) of the MOSFET QN44 than the voltage of 3 volts at the output terminal OUT is applied to the gate of the MOSFET QN42 as shown in FIG. 13C. When the clock signal from the clock pulse generator CLG becomes "1" level, i.e., 5 volts under this state, this clock pulse is superposed on the gate voltage of the MOSFET QN42, and the gate voltage of this MOSFET QN42 is abruptly raised up to substantially 6 volts, as shown in FIG. 13C. Thus, the voltage of 5 volts obtained by subtracting the threshold voltage (1 volt) of MOSFET QN42 from the gate voltage is supplied to the output terminal OUT as shown in FIG. 13B. When the clock signal then becomes "0" level, the gate voltage of the MOSFET QN42 instantaneously lowers to approximately 2 volts as shown in FIG. 13C, but is immediately raised up to approximately 4 volts by the voltage of 5 volts of the output terminal OUT. When the clock signal becomes "1" in this state, the voltage of the output terminal OUT and the gate voltage of the MOSFET QN42 are respectively raised in the same manner as described above as shown in FIGS. 13B and 13C, a similar operation is repeatedly executed, and the voltage of the output terminal OUT is raised to become the value equal to the step-up voltage VCH applied to the high voltage terminal VH. In this case, since the gate voltage and source voltage of the MOSFET QN40 are respectively set to 0 volt and 5 volts, i.e., the gate voltage of this MOSFET QN40 is set to −5 volts with respect to the source thereof, the MOSFET QN40 does not become ON unless the absolute value of the threshold voltage of this MOSFET QN40 is 5 volts or higher. Therefore, the current does not flow from the output terminal OUT to the input terminal IN through the MOSFET QN40. Further, in this case, since the output signal of the CMOS inverter INV composed of the MOSFETs QP40 and QN41 is maintained at "0" volt, the MOSFET QN43 remains OFF.

On the other hand, when the input signal is "0" level, the output signal of "1" level is generated from the CMOS inverter INV, and the MOSFET QN 43 becomes ON. Thus, the gate voltage of the MOSFET QN42 is maintained at "0" level irrespective of the clock pulse from the clock pulse generator CLG. In this manner, the MOSFET QN42 is maintained in OFF state, and the voltage applied to the high voltage terminal VH is not transmitted to the output terminal OUT through the MOSFET QN42.

When the control signal R/$\overline{W}$ of "1" level is generated so as to read out the data from the memory cell array 11 (in FIG. 2) will now be discussed. In this case, the clock pulse generator CLG stops operating, and the voltage equal to the power source voltage is applied to the high voltage terminal VH. When the input signal is "1" level, this "1" level input signal is transmitted to the output terminal OUT through the MOSFET QN40. In this case, the gate voltage of the MOSFET QN42 becomes approximately 4 volts, but when the MOSFET having small drive ability as the MOSFET QN42 is used or the voltage of 5 volts is applied to the high voltage terminal VH, the voltage of the output terminal OUT is not lowered. When the input signal is further "0" level, the voltage of the output terminal remains "0" level.

FIG. 14 shows a semiconductor integrated circuit according to still another embodiment of the invention. This circuit is constructed substantially in the same manner as that in FIG. 12 except that the n-channel MOSFETs QN45 and QN46 are employed instead of the MOSFETs QP40, QN41 and QN43 in the circuit in FIG. 12. An E-type MOSFET QN45 is coupled at the gate and the source thereof to an output terminal OUT, and a D-type MOSFET QN46 is coupled between a power source terminal VC and the drain of the MOSFET QN45. The gate of the MOSFET QN44 is coupled not to the output terminal OUT but to a node N6 between the MOSFETs QN45 and QN46, and a reset pulse generator RPG, for generating a rest pulse when a predetermined period of time is elapsed after the writing operation of a selected memory cell is finished, is coupled to the gate of the MOSFET QN46.

When the voltage of 5 volts is applied to the input terminal IN, a voltage of approximately 3 volts is presented at the output terminal OUT. In this case, the voltage at the node N6 is maintained at approximately 3 volts. Thus, the voltage lower in the amount corresponding to the threshold voltage of the MOSFET QN44 than the voltage of the note N6, i.e., approximately 2 volts, is applied to the gate of the MOSFET QN42. When a clock signal from the clock pulse generator CLG becomes "1" level or 5 volts in this state, the gate voltage of the MOSFET QN42 is raised to approx. 6 volts. Thus, the voltage of the output terminal OUT is raised to the voltage level of 5 volts obtained by subtracting the threshold voltage of 1 volt of the MOSFET QN42 from the gate voltage of 6 volts. When the voltage of the output terminal OUT is 5 volts or higher, the voltage of the node N6 is maintained at a level lower by 1 volt than this. Thereafter, the voltage of the output terminal OUT is stepwisely raised in response to the clock signal from the clock pulse generator CLG until becoming equal to the step-up voltage VCH in the same manner as the case of the embodiment shown in FIG. 12. In this case, the output signal from the reset pulse generator RPG is "0" level, and the MOSFET QN46 coupled at one terminal to the power source terminal VC is maintained OFF.

Whenever the writing operation of a selected memory cell is finished, the control signal R/$\overline{W}$ becomes "1" level, the voltage of the output terminal OUT is decreased toward the voltage of the input terminal IN through the MOSFET QN40, and the gate voltage of the MOSFET QN42 also decreases as the voltage of the output terminal OUT is decreased. The reset pulse generator RPG generates a rest pulse when a predetermined period of time is elapsed from when the control signal R/$\overline{W}$ becomes "1" level to turn the MOSFET QN46 ON. Thus, the voltage of the node N6 is decreased to the power source voltage through the MOSFET QN46.

At reading operation time, the output signals of the clock pulse generator CLG and the reset pulse generator RPG are maintained at "0" level. When the input signal is "1", the input signal of "1" level is transmitted to the output terminal OUT through the MOSFET QN40. In this case, the voltage of the node N6 is set to approx. 4 volts, and the gate voltage of the MOSFET QN42 is set to approx. 3 volts, but the voltage of the output terminal OUT is not lowered by employing the MOSFET having low drive ability as the MOSFET QN42 or applying the voltage of 5 volts to the high voltage terminal VH in the reading mode.

When the input signal is "0" level, the MOSFETs QN42 and QN44 become OFF, so that the output terminal OUT is electrically separated from the high voltage terminal VH by the MOSFET QN42, with the result that the voltage of the output terminal OUT is maintained at "0" level.

The present invention has been described with respect to various embodiments. The present invention is not limited to the particular embodiments described above. For example, in the embodiment shown in FIGS. 7 and 8, one terminal of the MOSFETs QP11 and QN11 can be respectively coupled to the power source terminal VC and the output line OL. However, in this case, the back gate of the MOSFET QP11 is coupled not to the node N3 but to the power source terminal VC.

In the embodiment shown in FIG. 11, the current path between the step-up terminal VH and the ground terminal VS is interrupted by the MOSFET QN32. However, this MOSFET QN32 may be omitted by setting the breakdown voltage of the MOSFET QN30 to a high voltage.

Further, in the embodiments described above, the semiconductor integrated circuit associated with the address decoder has been described. However, any semiconductor integrated circuit may be applied to the present invention if any means for controlling the supply of the high voltage in response to the input signal is employed.

What is claimed is:

1. A semiconductor integrated circuit comprising:
   a voltage terminal connected to receive a high voltage,
   an output terminal,
   a first MOSFET coupled between said voltage terminal and said output terminal,
   a gate voltage setting MOSFET having a gate coupled to said output terminal, a first end coupled to said voltage terminal and the other end coupled to the gate of said first MOSFET, to set the gate voltage of said first MOSFET in accordance with the voltage of said output terminal,
   capacitive means, and
   a clock pulse generator for supplying a clock pulse to the gate of said first MOSFET, through said capacitive means.

2. A semiconductor integrated circuit according to claim 1, wherein a third MOSFET is coupled such that one end is coupled to said voltage terminal and the other end is coupled to the gate of said first MOSFET and supplied with an external signal to the gate thereof.

3. A semiconductor integrated circuit according to claim 1, wherein a MOSFET is coupled at the gate thereof to said output terminal at one end to said output terminal and at the other end to the gate of said first MOSFET.

4. A semiconductor integrated circuit according to claim 3, wherein a CMOS inverter is comprised of said gate voltage setting MOSFET and said third MOSFET for inverting a signal on said output terminal, and a MOSFET is coupled such that a first end is coupled to the gate of said first MOSFET and the other end is coupled to a reference voltage potential terminal, and receiving at the gate thereof the output signal of said CMOS inverter.

5. A semiconductor integrated circuit comprising:
an input terminal supplied with an input signal;
an output terminal;
a voltage terminal supplied with a high voltage;
a reference terminal set at a reference potential;
a first MOSFET of the depletion type and a first channel type which is connected at one end to said voltage terminal and whose gate is connected to said output terminal;
a second MOSFET of the enhancement type and a second channel type which is connected at one end to the other end of said first MOSFET, and at the other end to said output terminal, and whose gate is connected to said input terminal; and
a third MOSFET of the enhancement type and said first channel type connected between said output terminal and reference terminal and which has its gate connected to said input terminal.

6. A semiconductor integrated circuit comprising:
an input terminal supplied with an input signal;
an output terminal;
a voltage terminal supplied with a high voltage;
a reference terminal set at a reference potential;
a first depletion type MOSFET of a first channel type which is connected at one end to said voltage terminal and whose gate is connected to said output terminal;
a second enhancement type MOSFET of a second channel type which is coupled at one end to the other end of said first MOSFET and at the other end to said output terminal; and
inverting means connected between said output terminal and the gate of said second MOSFET.

7. A semiconductor integrated circuit according to claim 5 further comprising a fourth MOSFET of the depletion type and said first channel type having its gate connected to said output terminal, and having its current path coupled in series between said first and second MOSFETs.

8. A semiconductor integrated circuit according to claim 7, further comprising a MOSFET with its gate coupled to said input terminal, and its current path connected between a power source terminal and a node between said first and second MOSFETs.

9. A semiconductor integrated circuit according to claim 8, further comprising a MOSFET connected to receive a predetermined voltage at its gate and coupled between said output terminal and said third MOSFETs.

10. A semiconductor integrated circuit according to claim 7, further comprising a MOSFET connected to receive a predetermined voltage at its gate and coupled between said output terminal and said third MOSFETs.

11. A semiconductor integrated circuit according to claim 5, further comprising a MOSFET connected to receive a predetermined voltage at its gate and coupled between said output terminal and said third MOSFETs.

12. A semiconductor integrated circuit according to claim 5, further comprising a MOSFET coupled at the gate thereof to said input terminal, and at the current path thereof between a power source terminal and a node between said first and second MOSFETs.

13. A semiconductor integrated circuit according to claim 6, further comprising at least third and fourth MOSFETs coupled to first and second power source terminals, the gate of said third MOSFET connected to said output terminal, the node between said third and fourth MOSFETs being connected to the gate of said second MOSFET.

14. A semiconductor integrated circuit according to claim 13, further comprising a fifth MOSFET coupled at the gate thereof to said output terminal and at the current path thereof between said first and second MOSFETs, and a sixth MOSFET coupled at the gate thereof to the node between said third and fourth MOSFETs, and connected between a power source terminal and a node between said first and fifth MOSFETs.

* * * * *